United States Patent [19]

Einthoven et al.

[11] 4,035,757
[45] July 12, 1977

[54] SEMICONDUCTOR DEVICE RESISTORS HAVING SELECTED TEMPERATURE COEFFICIENTS

[75] Inventors: Willem Gerard Einthoven, Belle Mead; William Cordt Simpson, Middlesex, both of N.J.

[73] Assignee: RCA Corporation, New York, N.Y.

[21] Appl. No.: 634,490

[22] Filed: Nov. 24, 1975

[51] Int. Cl.² .......................................... H01C 7/04
[52] U.S. Cl. .................................. 338/25; 29/612; 357/28
[58] Field of Search ................ 338/25, 7, 9, 13, 25; 357/28, 65; 29/612, 619, 589, 621

[56] References Cited

U.S. PATENT DOCUMENTS

| | | |
|---|---|---|
| 3,445,301 | 5/1969 | Topas et al. .................. 357/71 X |
| 3,491,325 | 1/1970 | Hu ................................. 338/7 |
| 3,629,782 | 12/1971 | Sahni ........................... 338/308 |

Primary Examiner—C. L. Albritton
Attorney, Agent, or Firm—H. Christoffersen; R. P. Williams; R. A. Hays

[57] ABSTRACT

Two conductors are in resistive contact in spaced apart relation with a body of semiconductor material, e.g., silicon of P type conductivity, which is relatively lightly doped at the areas of contact, the electrical resistance at the areas of contact decreasing with increasing temperature. In one embodiment, portions of the conductors contact spaced apart regions of the body which are relatively highly doped at the areas of contact, parallel paths for current having different resistance characteristics thus being provided through the body between the conductors.

7 Claims, 6 Drawing Figures

SEMICONDUCTOR DEVICE RESISTORS HAVING SELECTED TEMPERATURE COEFFICIENTS

This invention relates to semiconductor devices, and in particular to means for providing resistors within such devices having selected temperature coefficients.

In various semiconductor devices, particularly integrated circuits including various circuit elements such as transistors and resistors, there occasionally exists a need for a resistor having a negative temperature coefficient, i.e., a resistor whose resistance value decreases with increasing temperature, or a resistor having a generally zero temperature coefficient, i.e., a constant resistance value with temperature. Such needs are satisfied in accordance with this invention in an extremely simple and straightforward manner.

The basis of the invention is the recognition that the contact resistance, on a unit area basis, between certain metals, e.g., nickel, and certain semiconductor materials, e.g., P conductivity type silicon, which are relatively lightly doped where the metal contacts the semiconductor, is temperature dependent, i.e., the contact resistance decreases with increasing temperature. This phenomenon is utilized to provide a resistor having a desired temperature coefficient as follows.

Figure 1:
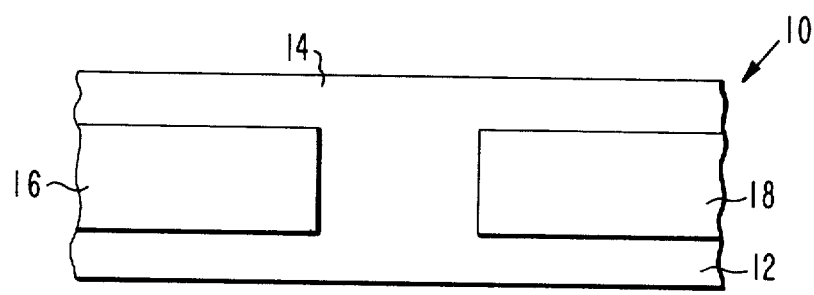
FIG. 1 is a plan view of a resistor made in accordance with this invention.

A resistor, indicated generally at 10 in FIG. 1, comprises a portion 12 of a body of semiconductor material, such as silicon, the body being, for example, a chip or pellet containing numerous circuit components (not shown) providing an integrated circuit. The portion 12 is preferably lightly surface doped P-type material, for example having a surface concentration of about $10^{18}$ atoms/cm$^3$.

Disposed on a surface 14 of the portion 12 are two spaced apart conductors 16 and 18. Preferably, for reasons discussed herein, at least one of the conductors, for example the conductor 16, is nickel while the conductor 18 may be aluminum. The use of layers of nickel or other metals as low resistance ohmic contacts to bodies of semiconductor material is well known, a recognized requirement to achieve low contact resistance being that the doping concentration in the semiconductor material be relatively high, for example about $10^{20}$ atoms/cm$^3$, where it is contacted by the metal contact.

The unit area contact resistance between the lightly doped portion 12 and the nickel conductor 16 however is relatively high at room temperature, but, we discovered, decreases with increasing temperature. That is, the contact resistance has a negative temperature coefficient. The unit area contact resistance between the lightly doped portion 12 and the aluminum conductor 18 is relatively low at room temperature and does not vary significantly with temperature.

Contact resistance is thus a function of temperature and surface doping; the higher the doping, the lower the contact resistance. At surface dopings in excess of about $10^{19}$ atoms/cm$^3$ for P type dopants, the contact resistance tends to become so small that variations thereof with temperature are hardly noticeable. The surface doping "depth" of significance with respect to the contact resistance is small; only the doping concentration within about 10 micrometers of the body surface likely affecting the contact resistance. The actual relationships among surface depth, doping concentrations, and contact resistance are not known. Such relationships, however, do not appear critical to the practice of the invention.

Although nickel has been specifically discussed with a semiconductor material of P type silicon, it is expected that a negative coefficient of contact resistance is present with other contacting metals, e.g., cobalt, chromium, and tungsten, of the type which are not P type dopants, i.e., which do not tend to induce P type conductivity characteristics in silicon.

The portion 12 may also be N-type material. However, with N type silicon, the contact resistance even at comparatively lightly doped surface regions tends to be quite low. At extremely low surface doping concentrations of N type silicon, the contact resistance tends to be rectifying and non-ohmic, and thus not as suitable for use as a resistor in accordance with this invention.

The contact resistance between the metal conductor 16 and the lightly doped portion 12, it is noted, is not completely ohmic, there being a slight difference in resistance depending upon the value of voltage applied across the resistor. The resistance variation is small, however, being generally less than about 20%, and, with respect to many semiconductor device applications, the resistor can be considered as being "ohmic."

While silicon has been specifically preferred the negative coefficient characteristics may be obtained with other semiconductor materials, e.g., germanium. Such a germanium resistor comprising, for example, a nickel conductor in contact with a surface region of germanium doped P type at a concentration of less than about $10^{16}$ atoms/cm$^3$.

The total resistance, including the contact resistance and the effective resistance of the portion 12, measured between the conductors 16 and 18, has a temperature coefficient which is selectable. It is known that the temperature coefficient of semiconductor material is dependent upon the impurity concentration therein. Further, in the present resistor 10, the amount of the total resistance provided by the portion 12 is determined by the spacing between the conductors 16 and 18. Thus, by adjusting these parameters the temperature coefficient of the resistor 10 may be selected. For example, if a negative temperature coefficient (resistor 10) is desired the temperature coefficient of the portion 12 is adjusted, by known methods, to be less, in absolute value, than the negative temperature coefficient of the unit area contact resistance of the conductor 16. If, alternatively, a resistor 10 having an overall positive coefficient is desired, the temperature coefficient of the portion 12 is adjusted to be greater, in absolute value, than the negative temperature coefficient of the unit area contact resistance of the conductor 16. Of course, if the absolute value of the temperature coefficients of the portion 12 and the contact resistance of the conductor 16 are equal, the resistor 10 is temperature insensitive.

Figure 2:
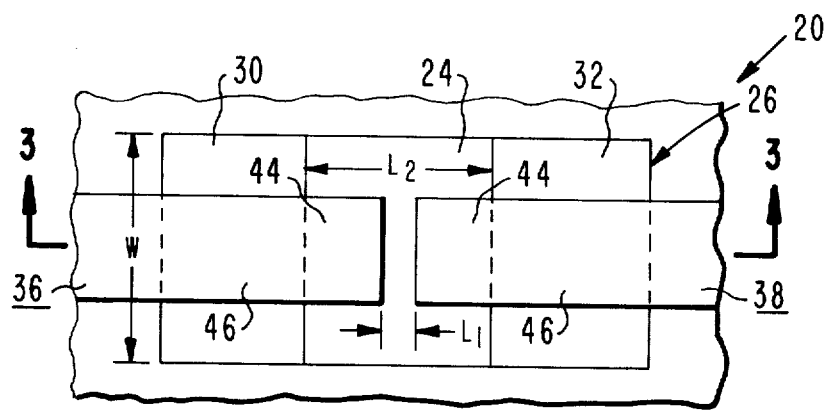
FIG. 2 is a plan view of another resistor made in accordance with this invention.
Figure 3:
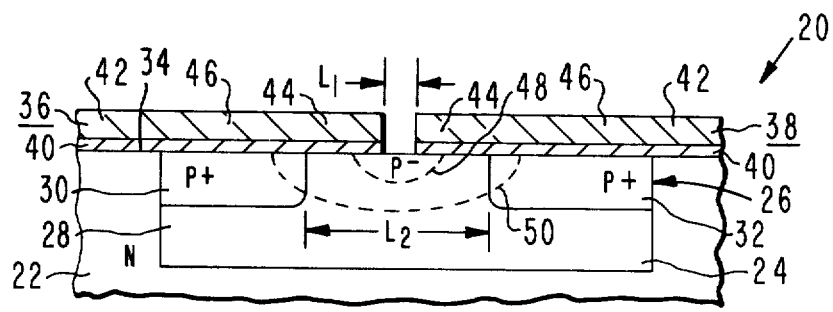
FIG. 3 is a cross-sectional view of the resistor taken along line 3—3 of FIG. 2.

Another embodiment of the invention is illustrated at 20 in FIGS. 2 and 3. In this embodiment, a portion 22 of a body of semiconductor material contains a first region 24 having one type conductivity, for example P type, surrounded by semiconductor material having a second type conductivity, for example N type. The N type material establishes the border of the resistor 26; the doping of this material being of little significance although the N type material preferably forms a rectifying PN junction 28 with the P type material of the resistor 26. For example, the N type material can be uniformly doped at a concentration of about $10^{15}$ atoms/cm$^3$.

The resistor 26 comprises a first region 24 having a relatively low surface doping, e.g., a surface concentration of about $10^{18}$ atoms/cm$^3$, and two second regions 30 and 32 having a comparatively high surface doping, e.g., a surface concentration of about $10^{20}$ atoms/cm$^3$, the second regions 30 and 32 being disposed within and spaced apart by material of the first region 24.

Disposed on a surface 34 of the portion 22 are two spaced apart conductors 36 and 38 each comprising, in this example, a first thin layer 40 of nickel, e.g., about 100 Å thick, in direct contact with the surface 34, and a second covering layer 42 of solder, e.g., 95% lead, 5% tin, by weight, having a thickness of about 0.4 mil (about 10 micrometers). Each conductor 36 and 38 includes a proximal portion 44 and a distal portion 46. Each distal portion 46 of the conductors 36 and 38 overlies and contacts a different one of the highly surface doped second regions 30 and 32 and the proximal portion 44 of each conductor 36 and 38 overlies and contacts the lightly surface doped first region 24, the two conductors being spaced apart a distance $L_1$ along the surface 34. The two highly doped second regions 30 and 32 are spaced apart a distance $L_2$ through the first region 24, the distance $L_2$ being greater than the distance $L_1$, as shown.

Because of the relatively high surface doping of the second regions 30 and 32, the unit area contact resistance between these regions and the conductors 36 and 38 is quite low.

For convenience, the flow of current between the two conductors 36 and 38 can be thought of as being primarily along two main paths through the region 24: one path (FIG. 3), designated by the dashed line 48, being between the facing proximal portions 44 of the two conductors 36 and 38 through the contact resistance between these portions 44 and the low surface doped region 24; and the other path, designated by the dashed line 50, being between the distal portions 46 of the conductors 36 and 38 through the contact resistance between these portions and the highly surface doped regions 30 and 32. The two current paths 48 and 50 are in electrical parallel relation with one another.

At low temperature, e.g., room temperature, the unit area contact resistance between the proximal portions 44 of the conductors 36 and 38 and the low surface conductivity first region 24 is high, and the total resistance along the path 48, even though of shorter length than the path 50, is higher than that along the path 50. With increasing temperature, however, the contact resistance between the region 24 and the proximal portion 44 of the conductors 36 and 38 decreases, by about 1.5% per degree Centigrade. The result being, with the proper choice of parameters as discussed above, that the total resistance between the conductors 36 and 38, comprising the parallel resistance along the paths 48 and 50, also decreases.

The presence of the relatively high surface conductivity second regions 30 and 32 accomplishes two results. First, if these second regions were not present, the resistor 26 thus simply comprising two spaced apart conductors 36 and 38 contacting lightly doped surface portions of the first region 24 of semiconductor material, the resistance value of the resistor would be the series sum of the bulk resistance of the first region 24 between the conductors 36 and 38 plus the contact resistance between the conductors and the first region 24. Owing to the comparatively high contact resistance between the conductors 36 and 38 and the first region 24, the low temperature resistance of such a resistor "tends" to be somewhat high, and possibly higher than that desired in any given device. The parallel path for current provided by the high surface doped second regions 30 and 32 provides a convenient means of obtaining resistors having somewhat lower (as desired) resistances at low temperatures.

A second result provided by the two second regions 30 and 32 of high surface doping is that somewhat smaller resistance tolerances are obtained. For example, in the absence of these regions, the resistance tolerance is determined largely by the tolerance of the contact resistance between the conductors and the low surface doped semiconductor body, the resistance tolerance associated with the semiconductor material itself being, it is found, somewhat smaller than that of the contact resistance. With the second regions 30 and 32 present, however, the maximum resistance of the resistor 26 at any temperature is limited by the resistance along the path 50 (FIG. 3) through these regions. For this path, the resistance tolerance is determined substantially solely by that of the semiconductor material since the contact resistance between the conductors and the high surface doped second regions 30 and 32 is consistently extremely low. Similarly, the presence of the parallel path 50 in the arrangement shown in FIGS. 2 and 3 tends to minimize variations of the minimum resistance of the resistor 26.

Figure 4:
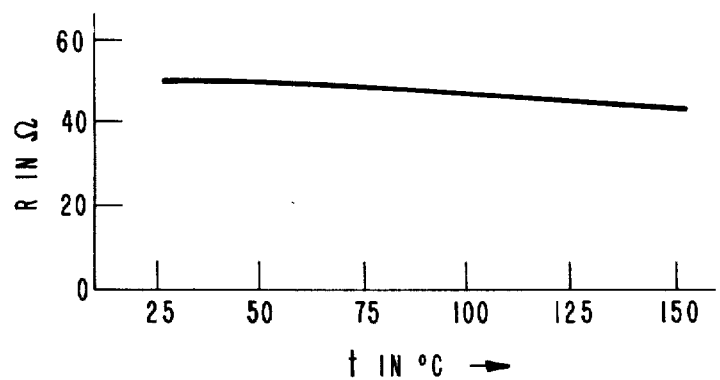
FIG. 4 is a graph plotting the variation of resistance of the resistor shown in FIGS. 2 and 3 against temperature.

By way of specific example, in this embodiment of the invention using a resistor structure as shown in FIGS. 2 and 3, the surface doping concentrations of the regions 30, 32 and 24 are as above stated, the second regions 30 and 32 having a sheet resistance of about 2 ohms/square, the first region 24 having a sheet resistance of about 30 ohms/square, and the width W (FIG. 2) of the regions 30, 32 and 24 being about 4 mils (100 micrometers). The distance $L_1$ between the conductors 36 and 38 is about 2 mils (50 micrometers) and the distance $L_2$ between the second regions 30 and 32 is about 8 mils (200 micrometers). Each contact 36 and 38 has a width of about 2 mils (50 micrometers), thus providing each conductor with a contact area of about 6 mils$^2$ (0.0038 millimeters$^2$) with the lightly doped first region 24. The variation of resistance between the conductors 36 and 38 with temperature is shown in FIG. 4, wherein the ordinate of the graph is in ohms and the absissa of the graph is in degrees C.

Figure 5:
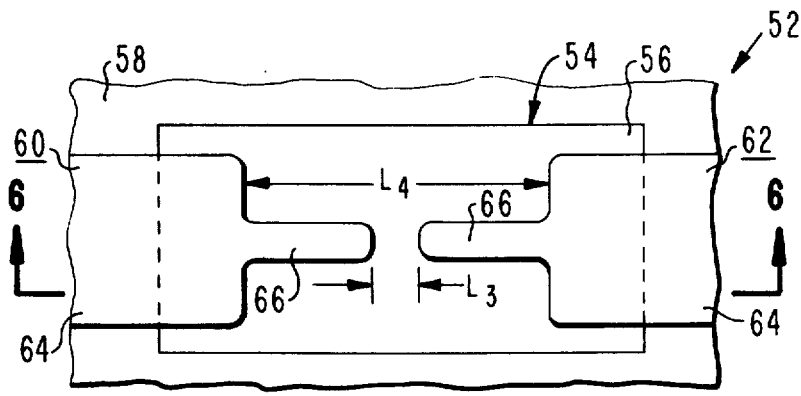
FIG. 5 is a plan view of another embodiment of the invention.
Figure 6:
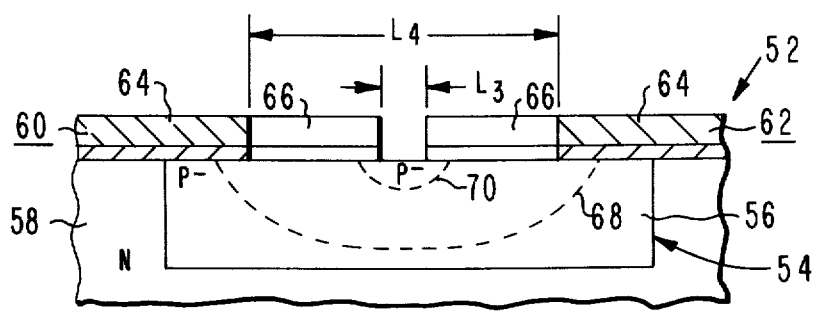
FIG. 6 is a cross-sectional view taken along line 6—6 of FIG. 5.

Another embodiment of the invention is illustrated at 52 in FIGS. 5 and 6. In this embodiment, regions of high surface conductivity are omitted, the resistor 54 comprising a single region 56 of low surface doped silicon, e.g., having a surface concentration of about 4 × $10^{18}$ atoms/cm$^3$, and having a sheet resistance of about 15 ohms per square, set in a portion 58 of N conductivity type silicon. Two conductors 60 and 62 of solder covered nickel are provided, each conductor including a relatively wide distal (with respect to the other conductor) portion 64 and a relatively narrow proximal portion 66, the distance $L_3$ between the facing edges of the proximal portions 66 of the two conductors being less than the distance $L_4$ between the facing edges of the distal portions 64 of the two conductors.

The contact resistance between each conductor 60 and 62 and the low surface conductivity region 56 is relatively high at low temperatures. However, owing to the greater area of contact between the distal portions 64 of the conductors and the silicon in comparison with the area of contact of the proximal portions 66 with the silicon, the total resistance along a path 68 (FIG. 6) of current through the region 56 between the distal portions 64 of the two conductors is less than that along a path 70 of current between the proximal portions 66 of the conductors. Thus, the wide distal portions 64 serve a function similar to that of the high surface conductivity second regions 30 and 32 of the embodiment shown in FIGS. 2 and 3 with respect to providing flexibility of design of the resistor. An advantage of the FIGS. 2 and 3 embodiment is that it does not require relatively wide conductor portions, thus conserving space on the silicon body. An advantage of the FIGS. 5 and 6 embodiment is that it does not require as many regions of different conductivities.

With respect to the conductors 36 and 38 shown in the FIGS. 2 and 3 embodiment, and the conductors 60 and 62 shown in the FIGS. 5 and 6 embodiment, it is believed that the negative temperature coefficient characteristic results solely from the contact between the nickel layer of these conductors and the silicon body. The covering layer of solder on the nickel layer is not believed to affect this characteristic, the solder layer being used solely as a means for increasing the thickness of the conductors and increasing the electrical conductivity thereof. Thus, the covering layer can be omitted or varied as desired.

The conductors shown herein can be provided according to known techniques, e.g., electroless plating of the nickel layer onto the silicon body, and a subsequent dipping of the body into a solder bath to coat the solder onto the previously plated nickel layers. The distances $L_1$ and $L_2$ of the conductors 36 and 38 and the distances $L_3$ and $L_4$ and shape of the conductors 60 and 62 may be designated to provide a resistor 26 or 54 which has a negative, zero, or even a slightly positive, temperature coefficient.

What is claimed is:

1. A semiconductor device comprising:
    a body of semiconductor material having a surface and having a one type conductivity; and
    two conductors in spaced apart relation making electrical contact with said body at said surface, each of said conductors include a distal portion and a proximal portion, at least each said proximal portion having a contact resistance with said semiconductor material which has a negative temperature coefficient.

2. A semiconductor device as claimed in claim 1 wherein:
    said body comprises a first region having said one type conductivity surrounded by semiconductor material having a second type conductivity and forming a PN junction with said first region, said first region being positioned such that said conductors contact said region at said surface.

3. A semiconductor device as claimed in claim 2 wherein said first region has P type conductivity and has a surface concentration of about $10^{18}$ atoms/cm$^3$.

4. A semiconductor device as claimed in claim 2 further comprising:
    two second regions having said one type conductivity and having a comparatively higher surface concentration of conductivity modifiers than said first region, said second regions being within said first region and being contacted by said distal portions of said conductors.

5. A semiconductor device as claimed in claim 4 wherein:
    said comparatively higher surface concentration is on the order of about $10^2$.

6. A semiconductor device as claimed in claim 1 wherein:
    said distal portions of said conductors contact a comparatively greater area of said surface than said proximal portions.

7. A semiconductor device as claimed in claim 1 wherein:
    said conductors are comprised of a metal which does not tend to induce conductivity modifiers of said one type conductivity into said body.

* * * * *